(12) United States Patent
Kim

(10) Patent No.: US 6,362,073 B2
(45) Date of Patent: Mar. 26, 2002

(54) METHOD FOR FORMING SEMICONDUCTOR DEVICE HAVING LOW PARASITE CAPACITANCE USING AIR GAP AND SELF-ALIGNED CONTACT PLUG

(75) Inventor: Jin-Woong Kim, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/740,948

(22) Filed: Dec. 21, 2000

(30) Foreign Application Priority Data

Dec. 24, 1999  (KR) .......................................... 99-61956

(51) Int. Cl.[7] ............................................. H01L 21/76
(52) U.S. Cl. ........................ 438/422; 438/411; 438/421
(58) Field of Search ................................. 438/586, 619, 438/400, 411, 421, 422

(56) References Cited

U.S. PATENT DOCUMENTS

| | | | | |
|---|---|---|---|---|
| 5,510,645 A | * | 4/1996 | Fitch et al. | 257/522 |
| 6,083,821 A | * | 7/2000 | Reinberg | 438/619 |
| 6,130,151 A | * | 10/2000 | Lin et al. | 438/619 |
| 6,180,453 B1 | * | 1/2001 | Sung et al. | 438/256 |
| 6,261,942 B1 | * | 7/2001 | Zhou et al. | 438/619 |

* cited by examiner

*Primary Examiner*—Richard Elms
*Assistant Examiner*—Adam Pyonin
(74) *Attorney, Agent, or Firm*—Finnegan, Henderson, Farabow, Garrett & Dunner, L.L.P.

(57) ABSTRACT

Disclosed is a method for forming a semiconductor device; and, more particularly, to a method for forming a semiconductor device with low parasite capacitance by using an air gap and a self-aligned contact plug formed by a selective epitaxial growing method. A method for forming a semiconductor according to the present invention comprises the steps of: forming word lines over a semiconductor substrate, wherein a plurality of contact areas are formed between the word lines; forming epitaxial layers for contact plugs on the contact areas, thereby forming a resulting structure; forming air gaps on non-contact areas on which the epitaxial layers is not formed, by depositing an interlayer insulation layer on the resulting structure; and patterning the interlayer insulation layer so as to expose the epitaxial layers. Accordingly, the present invention using the air gap as a gap filling materials reduces the parasite capacitance loaded on a bit line and omits an additional gap filling process.

8 Claims, 1 Drawing Sheet

METHOD FOR FORMING SEMICONDUCTOR DEVICE HAVING LOW PARASITE CAPACITANCE USING AIR GAP AND SELF-ALIGNED CONTACT PLUG

FIELD OF THE INVENTION

The present invention relates to a method for forming a semiconductor device; and, more particularly, to a method for forming a semiconductor device with low parasite capacitance by using an air gap and a self-aligned contact plug formed by a selective epitaxial growing method.

DESCRIPTION OF THE PRIOR ART

Generally, the refresh time, which is one of the most important features in semiconductor memory device, may be determined by a leakage current which is caused by a drain damage and this drain damage is often generated at the time of forming a charge storage node contact for electrically connecting the charge storage electrode to the drain of a transistor. The resolution of current lithography techniques may prevent a misconnection in 16M DRAM manufacturing processes or less, which may be caused by an undesired connection to other layers at sidewalls of a contact hole, but the space between the contact hole and adjacent conducting layers in an interlayer insulating layer becomes narrower with the development of the integrated circuits.

The contact is minimized in order to solve the above-mentioned problem and this problem may be solved somewhat by modifying the exposure method in a step-and-repeat projection equipment (i.e., stepper), modifying mask to define the contact hole region, or using a self-aligned contact (hereinafter, referred to as SAC).

The most highlighted process is a nitride barrier SAC (hereinafter, referred to as NBSAC) process, in which a nitride layer is used as an etching barrier layer when an oxide layer is etched for forming the contact hole. The NBSAC process may be divided into two etching processes, i.e., oxide and nitride etching processes. In the oxide etching process, polymer-inducing gases, such as $C_3F_8$ and $C_4F_8$, are have been used in order to improve a selective etching rate to the nitride layer. The $C_3F_8$ and $C_4F_8$ gases induce a lot of polymer and then a high selective etching rate to the nitride layer may be obtain, but these gases may provoke a problem in that the oxide layer within the contact hole is not removed completely because the polymer may cause an etching stop of the oxide layer. Since the selective etching rate to the nitride layer and the etching stop of the oxide layer within the contact hole are contrary to each other, reappearance of the semiconductor devices may deteriorate and a process window of the contact hole may be narrow.

To make the process window broad, the processing conditions for etching the oxide layer is controlled by a polymer decreasing method. Accordingly, in the case where the oxide layer etching process is carried out by the polymer decreasing method, it requires that the nitride layer should be thick. However, the increase of the thickness of the nitride layer causes the contact area to be diminished and an isotropic etching process is applied to the nitride layer in order to make up for the diminution of the contact area.

Further, since the oxide layer under the nitride layer is used as an electrical insulating layer, the etching process requires that the oxide layer should be controlled by a high selective etching rate in order not to be damaged and a portion of a semiconductor substrate may be exposed at the time of etching an oxide layer in a periphery circuit area, the oxide etching process to minimize the loss of the exposed semiconductor substrate is required.

However, a conventional ion induced etcher to etch the nitride layer may not obtain such a high selective etching rate in the isotropic etching process. The recently highlighted radical etcher using the etchants, such as $NF_3$ and $CF_4$ and $SF_6$, provides an isotropic etching process and a high selective etching rate to the oxide layer, but it does not provide a high selective etching rate to a silicon layer (i.e., silicon wafer) because the etching process uses the fluorine-bearing etchants. Also, the etching rate of the radical etching equipment is determined by the coherence of the oxide, nitride and silicon layers because these etchants may etch all of the oxide, nitride and silicon layers. That is, in the case where the oxide layer, nitride layer and silicon layer may be placed in the order of coherence, it is impossible to obtain a high selective etching rate to a silicon layer because the silicon layer is etched most rapidly.

As a result, the conventional NBSAC process is not sufficient for a high selective etching rate and it is more difficult to obtain a processing margin in etching the oxide, nitride and silicon layers with the decrease of the yield of the semiconductor devices.

SUMMARY OF THE INVENTION

It is, therefore, an object of the present invention to provide a method for forming self-aligned contacts using a selective epitaxial growing method.

It is another object of the present invention to provide a method for improving electrical characteristics of a semiconductor device by reducing parasite capacitance.

In the present invention, a contact plug is formed on a contact area using a selective epitaxial growing method and a self-aligned contact which is formed by a selective etching rate between an epitaxial layer and an oxide layer.

In accordance with an aspect of the present invention, there is provided a method for forming a semiconductor comprising the steps of: forming word lines over a semiconductor substrate, wherein a plurality of contact areas are formed between the word lines; forming epitaxial layers for contact plugs on the contact areas, thereby forming a resulting structure; forming air gaps on non-contact areas on which the epitaxial layers is not formed, by depositing an interlayer insulation layer on the resulting structure; and patterning the interlayer insulation layer so as to expose the epitaxial layers.

BRIEF DESCRIPTION OF THE DRAWINGS

Other objects and aspects of the present invention will become apparent from the following description of the embodiments with reference to the accompanying drawings, in which.

DETAILED DESCRIPTION OF THE PREFERRED EMBODIMENTS

Hereinafter, the present invention will be described in detail referring to the accompanying drawings.

Figure 1A:
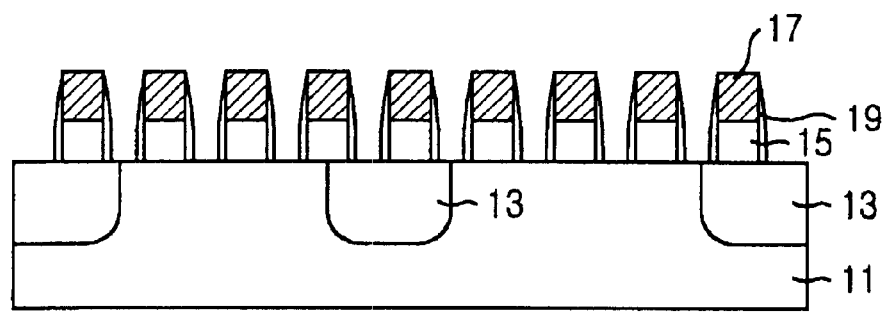
FIGS. 1A and 1B are cross-sectional views illustrating a method for forming a self-aligned contact with an air gap according to the present invention.
Figure 1B:
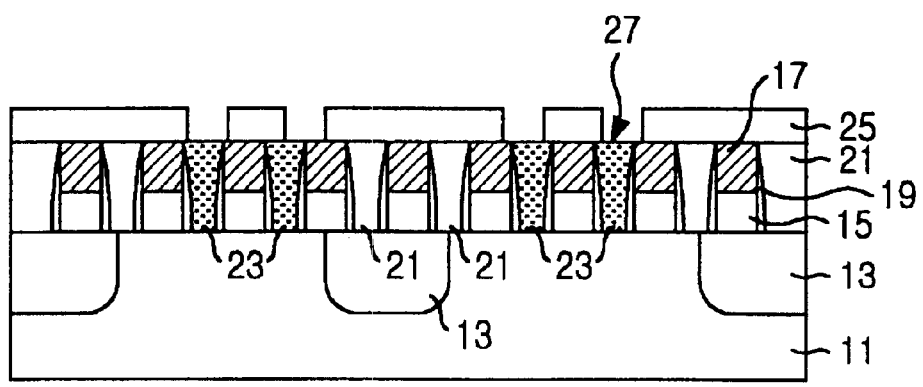

FIGS. 1A and 1B illustrate a method for forming a self-aligned contact with an air gap according to the present invention.

First, referring to FIG. 1A, field oxide layers 13 are formed in a semiconductor substrate 11 in order to define active regions and field regions (non-active regions). A conduction layer 15 for a gate electrode is formed on the semiconductor substrate 11 and a mask insulation layer 17, such as a nitride or oxide layer, is formed on the conduction layer 15. The mask insulation layer 17 and the conduction layer 15 are patterned in a predetermined size and an amorphous carbon layer for spacers 19 are formed on sidewalls of the mask insulation layer 17 and the conduction layer 15, thereby exposing portions of the semiconductor substrate 11 between the patterned stacks. At this time, the spacers 19 are made of as an oxide or nitride layer.

Referring to FIG. 1B, epitaxial layers 23 for a contact plug are formed on the exposed portion of the semiconductor substrate 11 by the selective epitaxial growing method. In the selective epitaxial growing method, the epitaxial layers 23 are formed only on the semiconductor substrate 11, such as a silicon or silicon-germanium layer, because the mask insulation layer 17 and the spacers 19 function as barriers to epitaxial growing. In the preferred embodiment, an insulation layer or a nitride layer (not shown) as a barrier layer to the epitaxial growth is formed on non-contact areas and this barrier layer is removed after forming the epitaxial layers 23.

After removing the barrier layer to the epitaxial growth, an interlayer insulation layer 25, an oxide layer, is formed on the resulting structure though the PECVD (Plasma Enhanced Chemical Vapor Deposition) method. When the interlayer insulation layer 25 is formed by the PECVD method, the non-contact areas between the word lines (the conduction layer 15 for a gate electrode) are filled with an air gap 21 because the PECVD method has a demerit in topology of the interlayer insulation layer 25. It is quite different from what is required in the general semiconductor processing techniques. Especially, in the PECVD method according to the present invention, the low power of RF bias is kept for poor topology of the interlayer insulation layer 25. The use of the air gap 21 may remove a gap filling process required in a conventional semiconductor processing method. In DRAM memory devices, this air gap 21 may reduce parasite capacitance. Typically, in the case where an oxide layer or a nitride layer, which has higher dielectric constant than the air, is used a gap filling materials, these materials may increase the parasite capacitance and require much more refresh operations of memory devives. However, since the present invention uses the air gap 21 as a gap filling materials, the parasite capacitance loaded on a bit line may be reduced and an additional gap filling process is not required.

After forming the interlayer insulation layer 25 having poor topology, the interlayer insulation layer 25 is patterned using an etching mask (not shown) so that the top surface 27 of the epitaxial layers 23 is exposed between the patterns formed by the interlayer insulation layer 25. At this time, although the patterns of the interlayer insulation layer 25 are misaligned, an undesired interconnection of the conduction layer 15 and the following conduction layer for a charge storage electrode may be prevented.

On the other hand, the interlayer insulation layer 25 is etched by carbon and fluorine-bearing gases and particularly, $C_2F_6$, $C_3F_8$, $C_4F_8$, $C_5F_8$, $C_4F_6$ and their mixtures may be used for a high selective etching rate to the interlayer insulation layer 25 against the interlayer insulation layer 25. Also, C, H and F-bearing gases, such as $CH_3F$, $CH_2F_2$, $C_2HF_5$, $C_3H_2F_6$ and their mixtures, may be used to increase the selective etching rate to the interlayer insulation layer 25. In the preferred embodiment, an inert gas, such as Ar or He, may be contained to stabilize plasma while the interlayer insulation layer 25 is etched and the isotropic dry-etching process is applied to the interlayer insulation layer 25 to remove polymer which may cause the epitaxial layers 23 to be damaged.

As apparent from the above, the present invention may omit an additional gap filling process with an epitaxial layer growth of a charge storage electrode. Accordingly, this reduced parasite capacitance improves operation speed of the memory devices and the epitaxial layer provides sufficient processing margin which increases the yield of the semiconductor memory devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a semiconductor device comprising the steps of:

forming a plurality of word lines over a semiconductor substrate apart from one another, wherein at least one sidewall of each word line is adjacent to a contact area or a non-contact area, and wherein a top surface of the word lines is covered with mask insulation layers;

forming spacers on sidewalls of the mask insulation layers and the word lines;

forming expitaxial layers for plugs in the contact areas;

forming an interlayer insulation layer on the mask insulation layers, on the epitaxial layers, and over the non-contact areas, and simultaneously forming air gaps surrounded with the semiconductor substrate, the spacers, and the interlayer insulating layer, in the non-contact areas; and selectively etching the interlayer insulation layer so as to expose the epitaxial layers.

2. The method as recited in claim 1, wherein the interlayer insulation layer is formed by a plasma enhanced chemical vapor deposition (PECVD) method with an RF bias in order to form the air gaps.

3. The method as recited in claim 1, wherein C and F-bearing gas plasma is used in the step of etching the interlayer insulation layer.

4. The method as recited in claim 3, wherein any one of the group consisting of $C_2F_6$, $C_3F_8$, $C_4$, $F_8$, $C_4F_6$, and their mixtures is used in the step of etching the interlayer insulation layer.

5. The method as recited in claim 3, wherein C, H, and F-bearing gas plasma is used in the step of etching the interlayer insulation layer.

6. The method as recited in claim 5, wherein any one selected form the group consisting of $CH_3F$, $CH_2F_2$, $C_2HF_5$, $C_3H_2F_6$, and their mixtures is used in the step of etching the interlayer insulation layer.

7. The method as recited in claim 1, wherein an isotropic dry-etching method is performed in the step of etching the interlayer insulation layer.

8. The method as recited in claim 1, wherein the spacers are formed with an oxide layer or a nitride layer.

* * * * *

UNITED STATES PATENT AND TRADEMARK OFFICE
CERTIFICATE OF CORRECTION

PATENT NO.     : 6,362,073 B2
DATED          : March 26, 2002
INVENTOR(S)    : Jin-Woong Kim It is certified that error appears in the above-identified patent and that said Letters Patent is hereby corrected as shown below:

Title page,
Item [57], ABSTRACT,
Line 16, "materials" should read -- material --.

Column 4,
Line 30, "expitaxial" should read -- epitaxial --.
Line 48, "$C_4$, $F_8$," should read -- $C_4F_8$, --.

Signed and Sealed this

First Day of July, 2003

JAMES E. ROGAN
*Director of the United States Patent and Trademark Office*